United States Patent [19]

Solie

[11] 4,079,342
[45] Mar. 14, 1978

[54] FANNED MULTISTRIP COUPLER FILTERS

[75] Inventor: Leland P. Solie, Acton, Mass.

[73] Assignee: Sperry Rand Corporation, New York, N.Y.

[21] Appl. No.: 723,407

[22] Filed: Sep. 15, 1976

[51] Int. Cl.² .................... H03H 9/04; H03H 9/26; H03H 9/32; H01L 41/10
[52] U.S. Cl. .................................... 333/72; 310/313; 333/30 R
[58] Field of Search ..................... 333/30 R, 72, 71; 310/8, 8.2, 9.7, 8.1, 313, 366, 9.4, 9.5; 331/107 A; 330/5.5; 29/25.35; 235/181; 252/62.9

[56] References Cited

U.S. PATENT DOCUMENTS

| 3,836,876 | 9/1974 | Marshall et al. | 333/30 R |
| 3,898,592 | 8/1975 | Solie | 333/30 R X |
| 3,916,347 | 10/1975 | Bert et al. | 333/30 R X |
| 3,947,783 | 3/1976 | Maerfeld | 333/30 R |
| 3,987,379 | 10/1976 | De Vries | 333/72 |
| 3,988,703 | 10/1976 | De Vries | 333/72 |

Primary Examiner—Alfred E. Smith
Assistant Examiner—Marvin Nussbaum
Attorney, Agent, or Firm—Howard P. Terry

[57] ABSTRACT

A multistrip surface acoustic wave filter having directional coupling characteristics may be used to transfer acoustic wave energy between acoustic wave channels or tracks. The devices are characterized by predetermined signal filtering pass bands, since the degree of transfer of energy is made a function of the excitation frequency. The fanned multistrip surface wave filter elements may be cascaded or weighted to provide a range of design selectivity of frequency response.

3 Claims, 8 Drawing Figures

FANNED MULTISTRIP COUPLER FILTERS

The invention herein described was made under a contract or subcontract thereunder with the United States Department of the Army.

BACKGROUND OF THE INVENTION

1. Field of the Invention

The present invention relates generally to acoustic surface wave energy processors employing acoustical means for processing electrical input signals and yielding modified output electrical signals and, more particularly, concerns multistrip coupling filters in which the filtered energy may be transferred from one wave propagating channel or track to another.

2. Description of the Prior Art

Prior art acoustic coupler devices, as will be further discussed, include acoustic multistrip directional coupling devices that do not in themselves have inherent filtering characteristics, since conventional input and output circuit elements associated with them determine the over-all pass bands of these devices.

SUMMARY OF THE INVENTION

Preferred forms of the present invention are represented by multistrip surface acoustic wave filter devices having directional coupling characteristics in which the degree of coupling depends upon the excitation frequency in a prescribed manner. The devices thus provide tailored filtering of energy transferred from one surface acoustic wave track to another. The devices have predeterminable pass band characteristics with minimum added insertion loss. The fanned multistrip wave filter elements may be cascaded or may be weighted to provide predetermined frequency responses.

DESCRIPTION OF THE PREFERRED EMBODIMENTS

Figure 1:
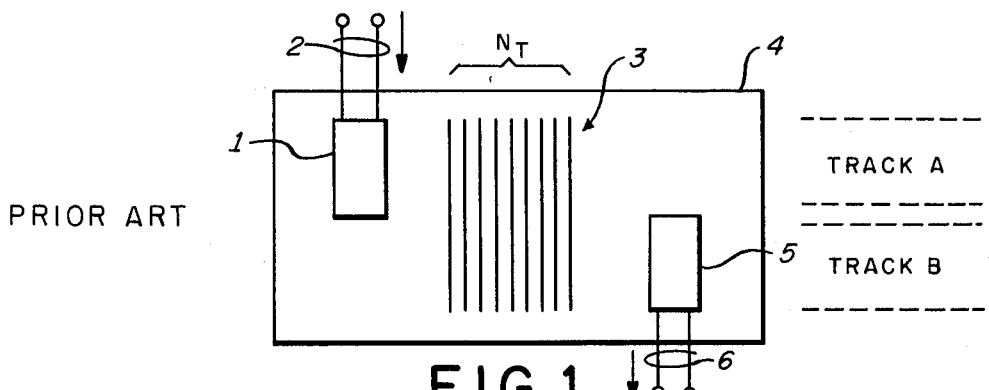
FIG. 1 is a representation of a prior art multistrip coupler device.

FIG. 1 illustrates the general structure of a prior art multistrip coupler including an array 3 made up of $N_T$ parallel electrically conductive metal strips affixed to the surface of a piezoelectric substrate 4. The device is adapted for coupling a traveling surface acoustic wave generated by an exciter transducer 1, fed with electrical signals via leads 2, into a surface layer of a substrate 4 along a propagation track A; coupling is into a generally parallel track B, were a second traveling surface wave flows in Track B into an output transducer 5 reciprocally analogous to input transducer 1. Thus, an electrical output appears on leads 6 and the simple multistrip coupler therefore represents a track changing directional coupler device which transfers an acoustic surface wave from one track to another. Track changing devices of generally similar nature to that of FIG. 1 have been discussed in the prior literature, as in the L. P. Solie U.S. Pat. No. 3,898,592 for "Acoustic Surface Wave Signal Processor", issued Aug. 5, 1975 and assigned to Sperry Rand Corporation. Reference may also be had to the technical paper "Surface-Acoustic-Wave Multiplexing Techniques" by H. Van de Vaart and L. P. Solie, *Proceedings of the I.E.E.E.,* May 1976, page 688 et seq.

As is well known in the art, there is a particular number $N_T$ of electrical current conducting strips required in array 3 for it to transfer all of the acoustic wave energy from track A to track B. In general, the pass band width of the prior art multistrip coupler is greater than that of its input and output circuits, so that such a multistrip coupler does not in itself further limit over-all frequency response, performing substantially no frequency filtering in itself.

Figure 2:
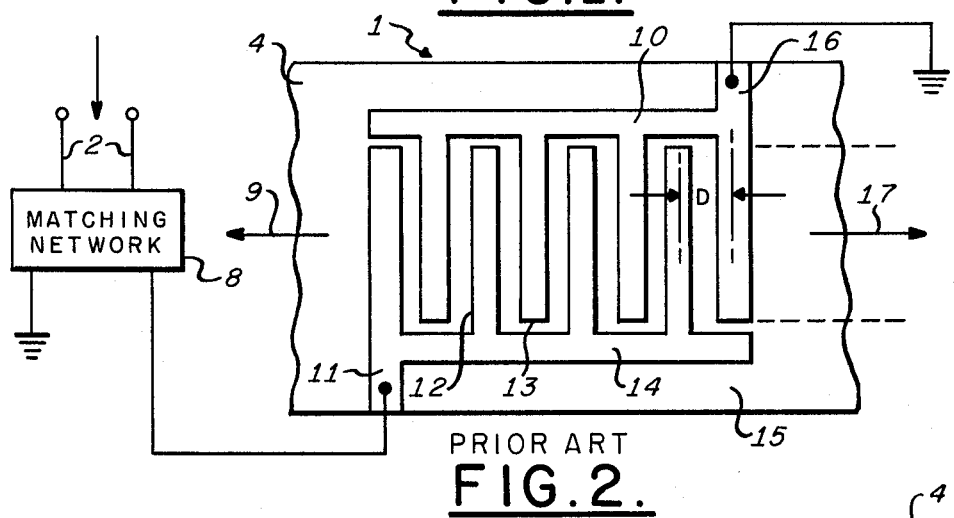
FIG. 2 is a plan view of a transducer useful for coupling electrical energy into and out of the present invention.

Multistrip couplers, including the novel multistrip coupler filters of the present invention, employ surfaces wave exciting or launching transducer devices kindred to that illustrated in FIG. 2. Removal of the surface wave or receiving it for generating a new electrical wave is accomplished by similar transducer structures, since the reciprocity theorem holds for the devices. While several types of surface wave exciter and receiver transducers are available in the prior art, one preferred form of the surface wave excitation means is illustrated in FIG. 2. The device 1 consists of a pair of electrodes 10, 14 with respective interdigital fingers of alternating instantaneous polarity, such as the respective fingers 12, 13. Standard photoetching and photoresist masking or other known techniques may be used to fabricate the thin conductors of the interdigital electrodes 12, 13, which electrodes may be made of aluminum or other electrically conducting material, and may have widths of the order of microns. Adjacent fingers of any one electrode, such as fingers 13 of electrode 10, are spaced substantially one wave length apart at the operating carrier frequency. The electrode device 10, 14 acts as an end fire array, propagating the desired forward flowing surface acoustic wave in the direction indicated by arrow 17 when driven by signals which may be passed through a conventional matching network 8 from a signal source (not shown) coupled to leads 2.

Where generation of an undesired reverse wave as indicated by arrow 9 may not be tolerated, this wave energy may be absorbed in a convenient acoustically matched absorber. For example, an end layer of a conventional acoustic absorbing material, such as wax or rubber or dielectric tape may be used. Since the reciprocity theorem evidently applies to the exciter of FIG. 2, a similarly constructed electrode system may act as a surface wave receiver 5, coupling to the traveling electric field associated with the surface elastic wave, and thereby yielding a useful electrical output at 6 for signal processing.

In operation, the exciter electrode system 1 of the transducer of FIG. 2, for example, interacts with the piezoelectric lithium niobate or other similar substrate 4, producing the two oppositely running surface acoustic waves 9, 17 flowing at right angles to the electrode fingers 12, 13. Adjacent fingers of electrodes 10, 14 are preferably spaced apart by an integral number of half wave lengths. The traveling wave in the exciter 1 is sucessively amplified as it passes under each pair of electrode fingers. The receiver electrode system 6 is similarly constituted and operates in the converse sense to reconvert the energy of the acoustic wave into a delayed electrical output signal. In both cases, it is preferred in the interest of efficiency to space the electrode fingers so that the condition of acoustic synchronism obtains, the traveling electric field at the exciter, for example, having the same periodicity as the electric field normally bound to the acoustic wave. For this condition, D in FIG. 2 is one half wave length.

In general terms, operation of the multistrip coupler may be described with reference to FIG. 1 by assuming that there are two equal width side-by-side acoustic paths (tracks A and B) at the surface of the piezoelectric substrate 4. Intersecting the tracks A and B and parallel to the wave fronts in FIG. 1 is an array 3 of parallel electrically conducting strips deposited on the surface of substrate 4 at the same time that the transducer electrodes are deposited, for example. The center-to-center spacing of the strip conductors is typically slightly less than half of the length of the shortest wave propagating into the structure. If a surface acoustic wave arrives from transducer 1 at the multistrip coupler 3, a portion of the input energy is transferred to and emerges in track B. The relative portion of acoustic energy transferred from track A to track B in FIG. 1 is a function of the number of strips $N_T$ used in array 3 and of the characteristic piezoelectric coupling strength of the piezoelectric substrate material. If $N_T$ strips are employed, all of the acoustic energy will be transferred to the opposite track, where $N_T$ is dependent upon the selected substrate. For Y-cut, Z-propagation LiNbO$_3$, the value of $N_T$ is about 103. If only $N_T/2$ conductive strips are used, half of the energy is transferred to track B and half remains in track A, yielding a sonic device generally analogous to a 3 dB. microwave coupler. Since the device of FIG. 1 is both a linear and reciprocal device, it is readily possible to inject waves into both tracks A and B, and to have the acoustic energy transfer totally to track A or to track B, or to be split in selected proportions between tracks A and B. The improved multistrip coupler filter devices of the present invention retain certain of the principal characteristics of the devices described in the foregoing discussion, but employ novel fanned, electrically conducting strip arrays that provide controllable filter characteristics; they are therefore referred to herein as fanned multistrip coupler filters. It will be understood by those skilled in the art that the relative proportions and the dimensions illustrated in the several drawings are selected for convenience in illustrating the prior art and the invention and that they do not necessarily represent proportions or dimensions that would be used in actual practice.

Figure 3:
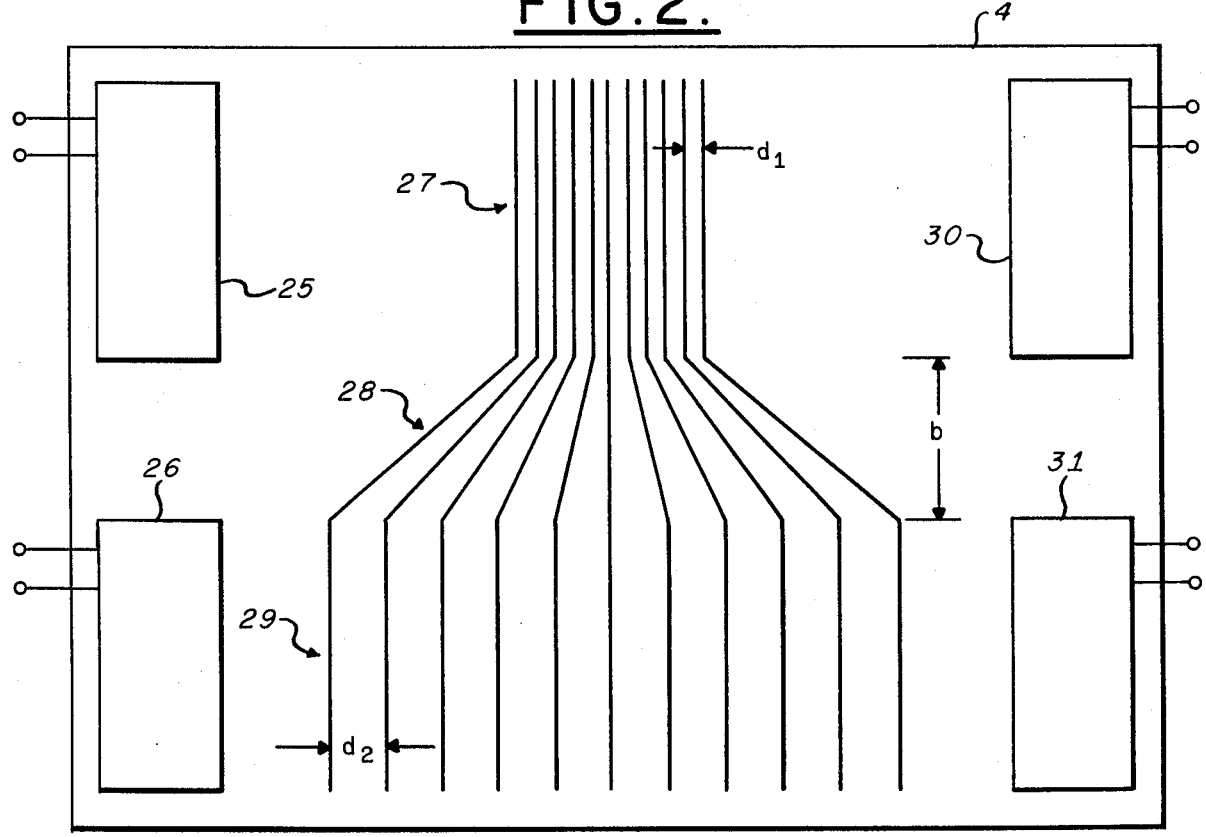
FIG. 3 is a plan view of a preferred form of the fanned multistrip coupler filter of the present invention.

Referring particularly to FIG. 3, one embodiment of the novel fanned multistrip coupler filter is shown using similar transducers 25, 26, 30, 31, each of which may be similar to the device 1 of FIG. 2. However, according to the invention, each or any of the transducer elements 25, 26, 30, 31 may be replaced by other kinds of acoustic surface wave input or output ports, such as by one track of a conventional multistrip coupler similar to that at 3 in FIG. 1. Other transducers or acoustic surface wave processing elements may be substituted. Accordingly, it is for the purpose of simplifying the discussion of the invention that elements 25, 26, 30, 31 are shown as transducers like that of FIG. 2, and that they are broadly referred to herein as acoustic surface wave port means 25, 26, 30, 31. Ports receiving energy that is not to be used externally may simply be terminated in a matched load in the usual manner. For example, if energy is to flow only from input port 25 to output port 31, matched loads may be coupled at ports 26, 30.

In FIG. 3, the fanned multistrip coupler filter lies between sets 25, 30 and 26, 31 of several surface wave ports. The filter comprises a first array 27 of parallel electrically-conducting strips affixed to substrate 4 and having a first periodicity $d_1$. It includes a second array 29 of parallel electrically conducting strips affixed to substrate 4 and having a second periodicity $d_2$. The array 27 lies on the acoustic track between surface wave ports 25 and 30, while the array 29 is spaced from array 27 and is disposed on a second acoustic track between surface wave ports 26 and 31. In the space between the acoustic tracks of arrays 27 and 29, the individual strips of arrays 27 are each joined by a corresponding electrical current conducting strip to a corresponding individual conducting strip of array 29, thus forming the fanned interconnect array 28 also affixed to the surface of substrate 4. As is seen, the individual spacings between adjacent strips of the fanned array 28 taper in magnitude. While it is often practical for the array system 27, 28, 29 to have line symmetry, complete symmetry is not required.

Assuming the periodicities $d_1$ and $d_2$ of the respective arrays 27 and 29 as shown in FIG. 3, a signal having an acoustic surface wave length $\lambda_c$ will be totally transferred from surface wave port 25 to flow into surface wave port 31 if $d_2 - d_1 = \lambda_c$, a situation providing the correct phase match for such an energy exchange. In other words, a surface wave at frequency $f_c$ in the first track will be phase matched to a second wave of the same frequency in the second track and there will be consequent energy interchange between the two tracks. Now, if the carrier frequency is varied from $f_c$, the matched condition no longer entirely prevails, and the fanned multistrip device transfers only a part of the acoustic wave energy from port 25 into port 31, energy also being transferred into port 30.

If the number of conducting strips in the fanned multistrip device is $N_T$, as previously defined, the frequency response for propagation between ports 25 and 31 is found to be a sin $x/x$ response centered at the central carrier frequency $f_c = v/\lambda_c$, where $v$ is the acoustic surface wave velocity of propagation. As would be predicted by the reciprocity theorem, there is a similar response between acoustic surface wave ports 26 and 30, 30 and 26, or 31 and 25. The widths of the pass band (between the two nulls associated with the main lobe at $f_c$), is 2 $f_c/N$, where N is the number of electrically conducting strips.

Figure 6:
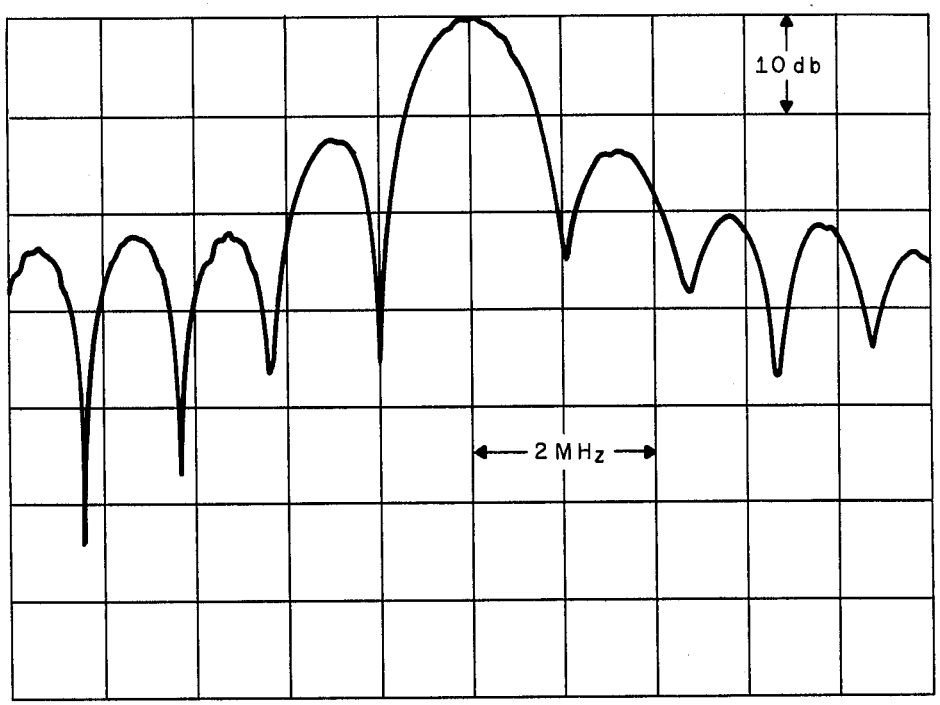
FIGS. 6 and 7 are graphs showing typical operating characteristics of the respective devices of FIGS. 3 and 4.

The individual strips of the fanned interconnecting array 28 act as electrical current connecting lines; they are acoustically substantially inactive because they are not disposed to present a significant degree of phase match with respect to acoustic surface waves. The lines of the fanned interconnect array 28 do, however, have finite electrical resistivity, so that they contribute to a degree to the total insertion loss of the multistrip coupler filter device. The capacitive loading between adjacent strips of the interconnecting array 28 tends to reduce the effectiveness of each such strip in energy transfer between the two acoustic wave tracks, thus increasing to a minor degree the required number of strips for the device. However, only ordinary adjustment techniques well known to the practitioner are required for empirical adjustment of the design predicted by the foregoing theory in order to obtain fully optimum performance of the invention. For example, the single stage apparatus of FIG. 3 was constructed and tested using one hundred conducting strips, with strip widths equal to 1250 microns, $d_1$ equal to 6.4 microns, $d_2$ equal to 22.4 microns, and $b$ equal to 800 microns. Generally, it is desirable to keep $b$ relatively small. The sin $x/x$ response shown in FIG. 6 is achieved at a center frequency $f_c$ of 212.4 MHz. The measured pass band width is substantially 4.2 MHz.

If the value of N exceeds $N_T$, waves of frequencies that were fully transferred to the second track start to transfer back to the first track, whereas waves of other frequencies continue to transfer from the first or input track to the second track, causing a dip in the primary pass band. This dip may advantageously be used to compensate for opposing effects inherent in elements associated with the device in the well known manner or to flatten the pass band.

As noted in the foregoing, the acoustic wave devices lying between ports 25, 26, 30, 31 may include additional elements. For example, in FIG. 3, an additional fanned microstrip coupler filter device vertically oriented beside the device 27, 28, 29 may be inserted between coupler 27, 28, 29 and ports 30, 31. In this situation, the wave progressing to the right from array 29 of FIG. 3 may flow into an input array 27 of another device like coupler 27, 28, 29. When the input of a second such fanned multistrip coupler follows the output of a first in this manner, the resulting pass band response is the product of the individual responses. Again, the pass band is taken to be the width between the nulls of the primary lobe.

Figure 4:
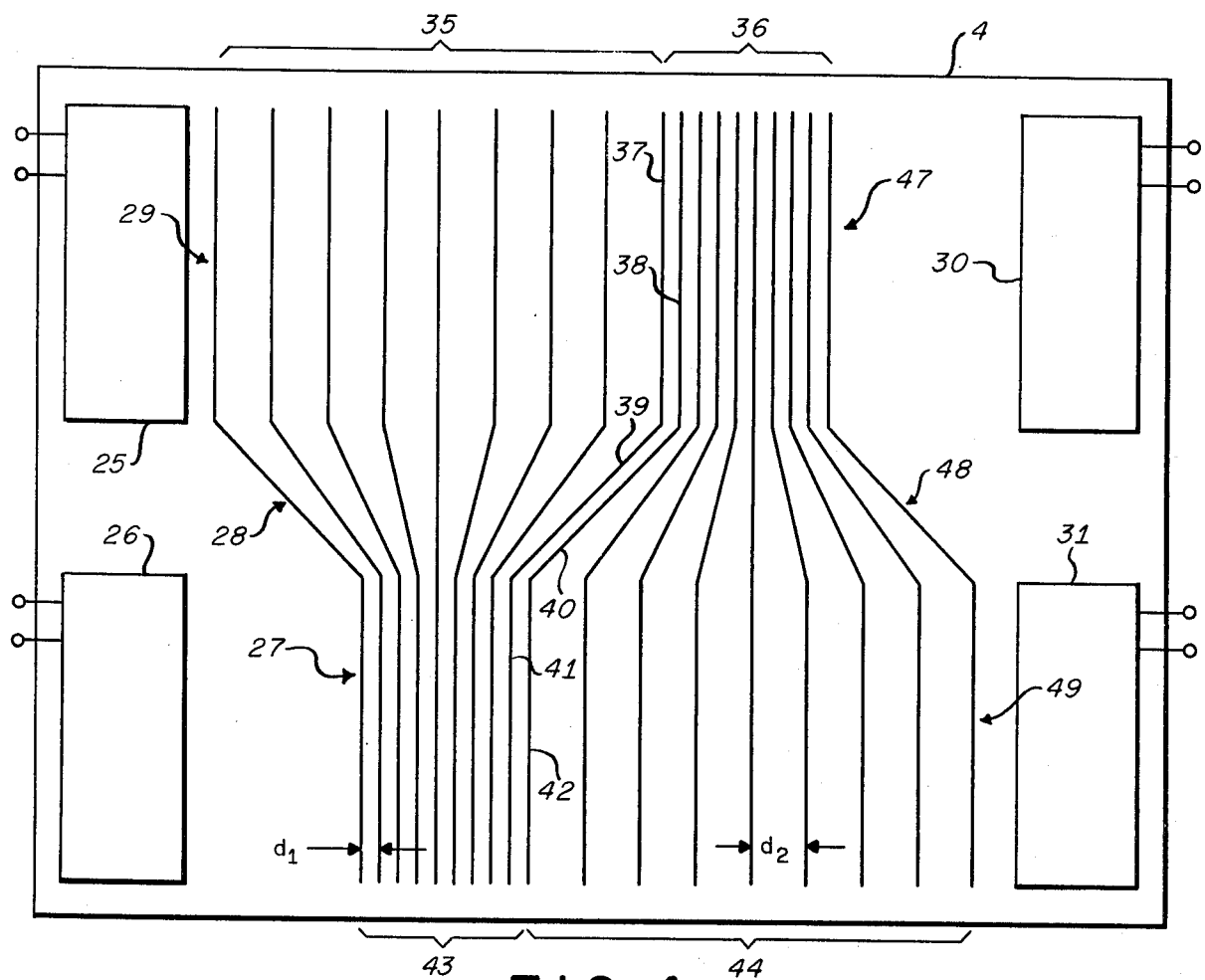
FIG. 4 is a plan view of an alternative form of the apparatus of FIG. 3.
Figure 7:
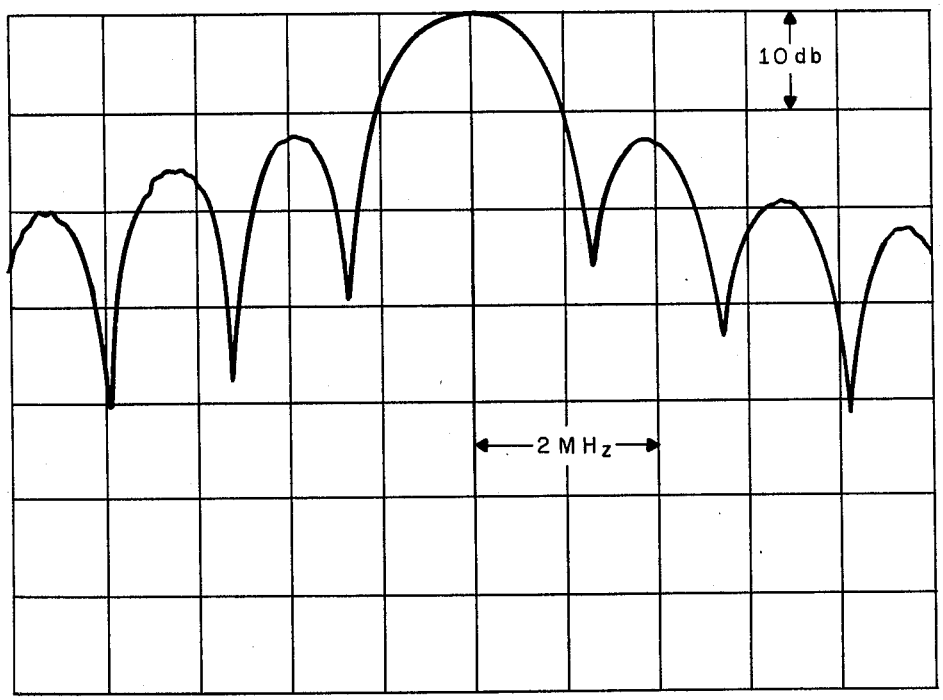

On the other hand, two or more fanned multistrip coupler filters may be cascaded as in the preferred arrangement of the invention appearing in FIG. 4. In the dual stage device of FIG. 4, the pass band response, as seen in FIG. 7, is advantageously the sum of the individual responses, rather than the product.

With particular reference to the structure of FIG. 4, the dual stage device consists of a first stage array 29 of periodicity $d_2$ located in a first track into which acoustic surface wave energy flows, for example, from input port 25. Any flow of energy in the first track then progresses in part into a second stage array 47 having a periodicity $d_1$. In the second or lower track of the device of FIG. 4, the first stage array 27 has a periodicity $d_1$, and is located with its array of conductor strips in parallel relation in the second track with a second stage array 49 of periodicity $d_2$.

Corresponding conductor strips of the first stage arrays 29 and 27 are connected by a fan of interconnecting strips forming the tapered interconnect array 28, in the manner of FIG. 3. Likewise, corresponding conductor strips of the second stage arrays 47 and 49 are joined by the interconnecting operation of the array 48. In this manner, arrays 29 and 49 of periodicity $d_2$ are connected in energy transfer relation by the respective fanned and oppositely tapered arrays 28 and 48 to arrays 27 and 47 of periodicity $d_1$. It will be observed that there is an intermediate section between the dual stage arrays that is formed by the strip pairs 37, 38 and 41, 42 joined by interconnect strips 39, 40 and that they lie in mutually parallel relation between coupling arrays 28 and 48. Strip 37 forms a transition between the sets of strips 35 and 36 of the respective arrays 29 and 47, while strip 42 forms a transition between the sets of strips 43 and 44 of the respective arrays 27 and 49. Transition strip 37 is joined by strip 39 to strip 41 lying within the interior of array 27; transition strip 42 is joined by strip 40 to strip 38 lying within the interior of array 47.

It will be observed that the structure of FIG. 4 presents point symmetry about the central point 43. The use of such symmetry is convenient in many applications, but is not entirely necessary for successful operation of the invention, since departure from such symmetry also yields useful results. For example, the strips 37 and 38, 39 and 40, and 41 and 42 may take the form of two straight parallel lines, with the fanned array systems 27, 28, 29 and 47, 48, 49 arranged in conformal fashion on either side of the parallel strip pair.

While operation of the embodiment of FIG. 4 is generally similar to that of FIG. 3, the improved result of FIG. 7 is obtained. Summing the response of at least a pair of such fanned microstrip coupler filters as shown in FIG. 7 permits the design of each fanned multistrip coupler with N strips for providing a null-to-null band width of the primary lobe of $2f_c/N$. However, the total acoustic energy which is transmitted to the output port 31 is a function of N', where N' is the sum of all of the strips in all of the cascaded section; i.e., N' is 18 in FIG. 7. For example, 150 strips may be required to transfer all of the acoustic signal from the input track to the output track in FIG. 3. In the case of this single fanned multistrip coupler filter, the band width would be $f_c/75$.

Assume that a design requiring a null-to-null band width of $f_c/25$ is desired. Three cascaded fanned multistrip couplers, cascaded in the manner of FIG. 4, would be employed. Following the coupler system 47, 48, 49 would be a third coupler system vertically oriented like system 27, 28, 29; there would be substantially 50 strips for each coupler. Accordingly, the band width between nulls of the primary lobe would be $2f_c/50$, or $f_c/25$, and a total of 150 conductive strips would be sufficient to couple all of the acoustic signal from one track to the other.

FIG. 7 represents a typical response for two cascaded, fanned multistrip coupler filters of the kind shown in FIG. 4. In this example, each multistrip coupler would have 80 conductive strips to provide a band width of 2 $f_c/80$ or 5.4 MHz, $f_c$ being 216.4 MHz; the coupling efficiency is, however, advantageously determined by the total number of conductive strips (180 in this case).

Figure 5:
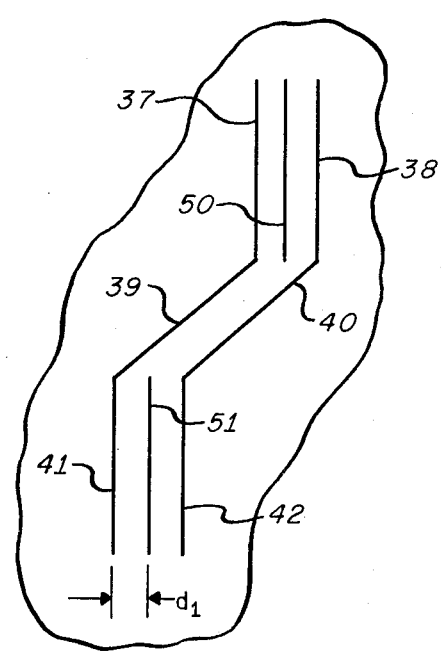
FIG. 5 is a fragmentary plan view of a modification of the apparatus of FIG. 4.

As illustrated in FIG. 5, the respective gaps between the strips 37 and 38, and 41 and 42 may be increased to correspond to the value $2d_1$, and additional strips 50 and 51 that have no connection through the interconnect zone may be respectively disposed in the middle of the gaps. These conductors 50 and 51 permit continuity in the acoustic properties of the first and second tracks, while desirably diminishing resistive losses and capacitive effects.

The fanned multistrip coupler elements of the present invention may be weighted by varying the periodicity of the conductive strips within the tracks while maintaining the aforementioned condition $d_2 - d_1 = \lambda$ for each gap between adjacent strips. As gap width is increased, the coupling efficiency decreases, thus providing a means for empirically adjusting the tap coupling weight of each cooperating strip pair.

Figure 8:
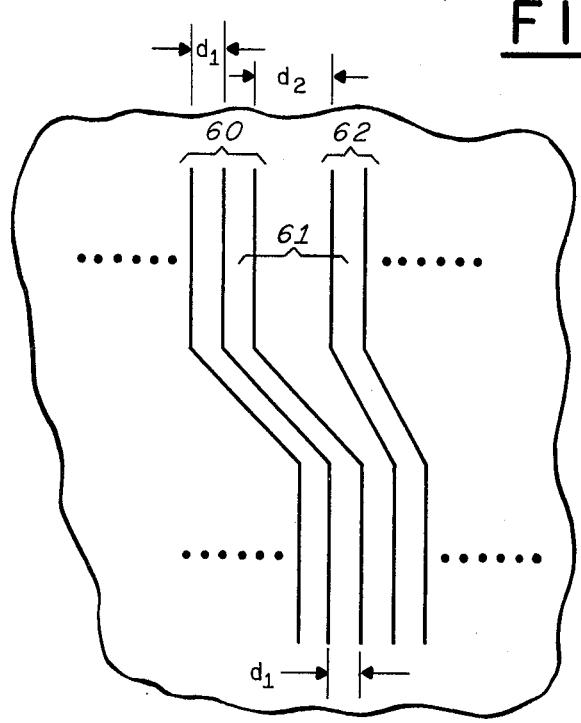
FIG. 8 is a fragmentary plan view of a modification of the fanned multistrip elements of FIGS. 3 and 4.

In particular and as seen in FIG. 8, the fanned multistrip coupler elements as employed in the invention may also be provided with weighted tap coupling by repeating the use of adjacent strips with the same off-set. For example, the three adjacent strips 60 of FIG. 8 each have, in the first track, separating gaps of dimension $d_1$, the gaps being the same size as each of the gaps in the second track. On the other hand, the gap at 61 is $d_2$ as previously defined. In this manner, the weighting factor described to each gap in the time domain is proportional to the number of times that a strip with a given off-set is repeated. In FIG. 8, the $d_1$ gap is used between three strips in the effective tap 60, while the $d_2$ gap is used between two strips in the effective tap 62, so that the relative weights of the two effective taps are 3 to 2.

Accordingly, it is seen that the invention is an acoustic surface wave energy processor employing acoustical means for processing electrical input signals and for coupling to selected outputs modified electrical signals having desirably altered frequency characteristics. The devices provide tailored filtering of sonic energy transferred from one surface acoustic wave track or channel to another such track or channel. The novel fanned multistrip surface wave filter elements may readily be cascaded or weighted to provide various desired frequency responses.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. Signal processing apparatus comprising:

substrate means for propagating an acoustic wave at a surface thereof, first transducer means for launching an acoustic wave along a first propagation track at said surface in a predetermined direction, second transducer means for converting into an electrical output an acoustic wave propagating along a second propagation track at said surface spaced from said first propagation track, and in said predetermined direction, a first array of substantially geometrically parallel electrically-conducting strips affixed to said surface and disposed across said first propagation track, a second array of substantially geometrically parallel electrically-conducting strips affixed to said surface and disposed across said second propagation track, and a third array of electrically conducting strips in mutually non-contacting relation affixed to said surface for interconnecting respective ones of said electrically-conducting strips of said first array to corresponding ones of said electrically-conducting strips of said second array, said first and second arrays having respective first and second predetermined periodicities, the difference between said periodicities being substantially equal to the predetermined operating wave length of said acoustic surface wave, said first predetermined periodicity being greater than said second predetermined periodicity, a fourth array of substantially geometrically parallel electrically-conducting strips affixed to said surface disposed across said first propagation track in substantially geometrically parallel adjacent relation with said first array, a fifth array of substantially geometrically parallel electrically-conducting strips affixed to said surface and disposed across said second propagation track in substantially geometrically parallel adjacent relation with said second array, and a sixth array of electrically conducting strips in mutually non-contacting relation affixed to said surface for interconnecting respective ones of said electrically conducting strips to said fourth array to corresponding ones of said electrically-conducting strips of said fifth array, the periodicity of said third array being the same as that of said second array, the periodicity of said fourth array being the same as that of said first array, and said third and sixth arrays forming oppositely tapered fan-shaped arrays.

2. Apparatus as described in claim 1 wherein:

a first pair of electrically-conducting strips is disposed between said first and fourth arrays, and a second pair of electrically-conducting strips is disposed between said second and sixth arrays in conductively coupled relation with said first pair, said first and second pairs of electrically-conducting strips having the same periodicity as said second and fourth arrays.

3. Apparatus as described in claim 1 wherein:

a first trio of electrically-conducting strips is disposed between said first and fourth array in geometrically parallel relation therewith, and a second trio of electrically-conducting strips is disposed between said second and sixth arrays in geometrically parallel relation therewith, only said first and third electrically-conducting strips of said first and second trios being conductively coupled, said electrically-conducting strips of said first and second trios having the same periodicity as said second and fourth arrays.

* * * * *